United States Patent [19]
Tanikoshi

[11] Patent Number: 5,015,839
[45] Date of Patent: May 14, 1991

[54] AUTOMATIC GAIN MULTIPLICATION FACTOR CONTROL APPARATUS AND METHOD

[75] Inventor: Sadao Tanikoshi, Tokyo, Japan

[73] Assignee: Kabushiki Kaisha Toshiba, Kawasaki, Japan

[21] Appl. No.: 400,085

[22] Filed: Aug. 29, 1989

[30] Foreign Application Priority Data

Oct. 21, 1988 [JP] Japan .................. 63-265345

[51] Int. Cl.⁵ .................. H01J 40/14; H03G 3/10
[52] U.S. Cl. .................. 250/214 AG; 330/278
[58] Field of Search ....... 250/214 AG, 214 A, 214 R, 250/214 C; 455/619, 601; 307/311, 269, 359, 358, 264, 360; 330/278, 279, 282, 284, 285, 127

[56] References Cited

U.S. PATENT DOCUMENTS

| | | | |
|---|---|---|---|
| 4,019,048 | 4/1977 | Maione et al. | 455/601 |
| 4,236,069 | 11/1980 | Laughlin | 250/214 R |
| 4,292,514 | 9/1981 | Ohtomo | 250/214 C |
| 4,399,565 | 8/1983 | Jarret et al. | 455/619 |
| 4,415,803 | 11/1983 | Muoi | 455/619 |
| 4,495,410 | 1/1985 | Minami et al. | 250/214 AG |
| 4,644,145 | 2/1987 | Gündner | 455/619 |
| 4,688,268 | 8/1987 | Holland | 250/214 AG |
| 4,730,128 | 3/1988 | Seki | 250/214 C |
| 4,805,236 | 2/1989 | Urala | 455/619 |

*Primary Examiner*—David C. Nelms
*Assistant Examiner*—Michael Messinger
*Attorney, Agent, or Firm*—Cushman, Darby & Cushman

[57] ABSTRACT

An apparatus and method for controlling gain automatically uses a light receiving element, a gain amplifier, a difference amplifier, a controller and a variable level circuit. The light receiving element generates electrical signals corresponding to received optical signals. The gain amplifier amplifies the electrial signals and the difference amplifier generates signals corresponding to the difference between defined level of amplified signal and predetermined level. In response to output signals from the difference amplifier, the controller generates signals for controlling gain of the gain amplifier and multiplication factor of the receiving element. The level circuit supplies signals to the receiving element in response to output signals from the controller.

30 Claims, 7 Drawing Sheets

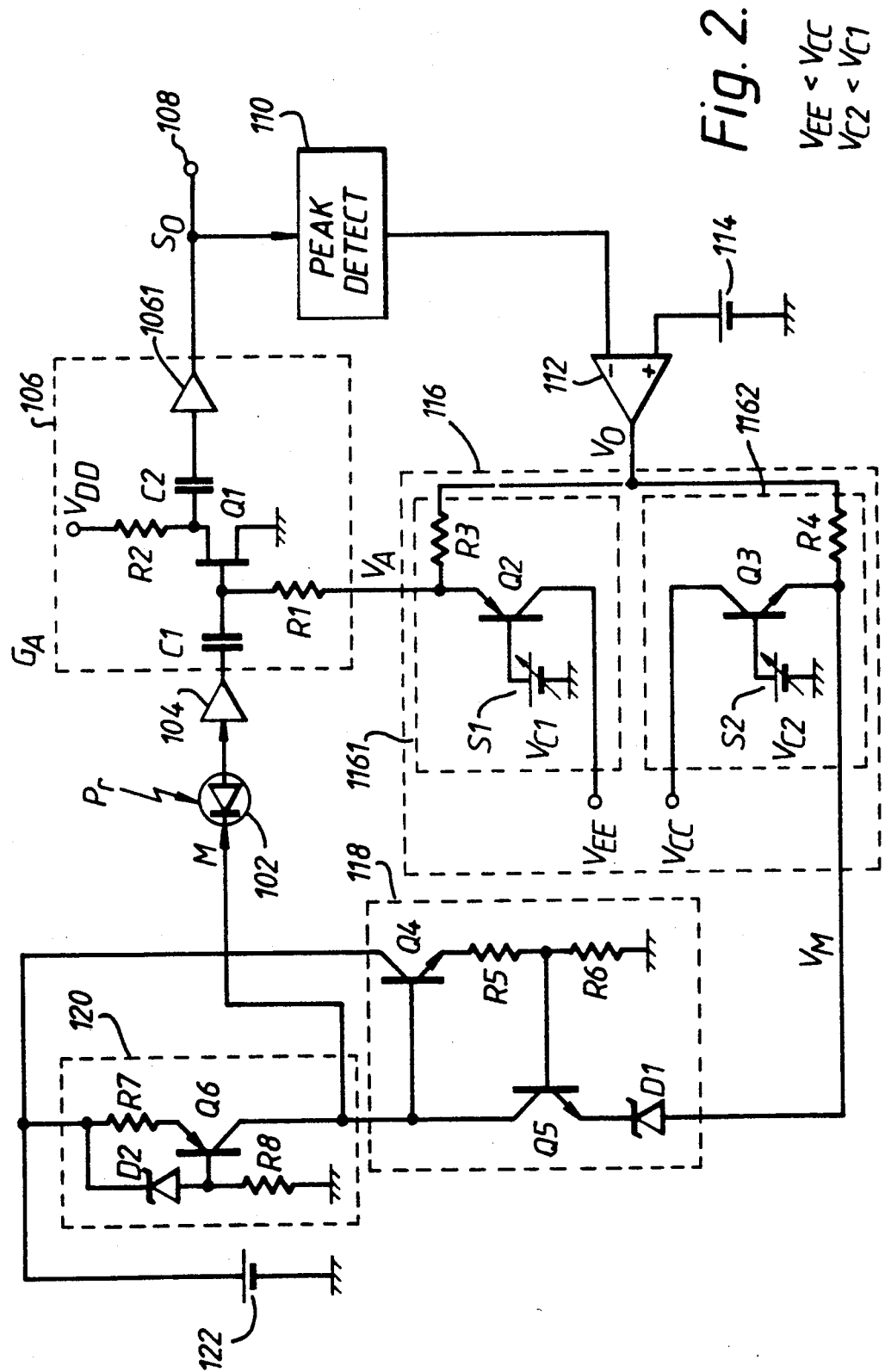

AUTOMATIC GAIN MULTIPLICATION FACTOR CONTROL APPARATUS AND METHOD

BACKGROUND OF THE INVENTION

1. Field of the Invention

This invention relates to an apparatus and method for controlling a multiplication factor of light receiving means and controlling a gain of amplifying means for electrical signals corresponding to the received light signals. More specifically, the invention relates to an automatic multiplication factor and gain control apparatus and method which has application in a repeater for an optical digital signal transmission apparatus, etc.

2. Description of the Related Art

In a repeater and a terminal equipment which are used in a optical digital transmission apparatus, a photoelectric converting circuit having a light receiving element, such as an avalanche photodiode, has been used. An automatic gain control apparatus is used for controlling the multiplication factor of the light receiving element and/or the gain of a circuit for amplifying electrical signals corresponding to the light received signals, by detection of peak levels of the electrical signals.

This type of apparatus needs to control two parameters—specifically the multiplication factor and the gain as mentioned above—based on one detecting signal from a detecting circuit which detects the peak levels of the electrical signals.

FIG. 11 shows a block diagram of an automatic gain control apparatus for such a purpose. This control apparatus includes a light receiving element 10 which may be an avalanche photodiode. The receiving element 10 receives optical signals with a signal level Pr, and converts the optical signals into electrical signals. The levels of these electrical signals are dependant on the bias to the receiving element. Output signals from the receiving element 10 are amplified by a pre-amplifier 12 and then by a variable gain amplifier 14. Output signals So from the amplifier 14 are supplied to an output terminal 16 and to a peak detecting circuit 18. The peak detecting circuit 18 detects peak levels of the output signals So over a period of time and generates peak voltage signals corresponding to the peak levels. A difference amplifier 20 compares the peak voltage signals from the peak detecting circuit 18 with a reference voltage signal Vref and produces amplified difference signals Vo corresponding to the difference between the peak voltage signals and the reference voltage signal Vref. An amplifying gain GA of the variable gain amplifier 14 is controlled by the amplified difference signals Vo from the difference amplifier 20. The amplified difference signals Vo are also supplied to a variable voltage circuit 22 which generates variable level signals which are supplied to the receiving element 10 as its bias to control its multiplication factor M. A switching means 24 has one position where the variable level signals are supplied to the receiving element 10, to set its multiplication factor M.

FIG. 12 shows characteristics of the relation between the optical signal level Pr, the multiplication factor M of the receiving element 10 and the amplifying gain GA of the variable gain amplifier 14.

When the optical signal level Pr is at its minimum value (Pr=P min), an optimum value Mopt of the multiplication factor M, at which the signal to noise ratio is maximum, should be set. Therefore, when the optical signal level Pr becomes less than a predetermined value Ps (Pr<Ps), the variable voltage signals are set in the variable voltage circuit 22 so that the factor M can be set to the optimum value Mopt. In FIG. 11, a comparing circuit 26 compares the voltage value of the amplified difference signals Vo from the difference amplifier 20 with a predetermined voltage value $V_{th}$. When the voltage value of the amplified difference signal Vo is less than the predetermined value $V_{th}$, the switching means 24 is commanded to change from the state shown in FIG. 11 to another state, by output signals from the comparing circuit 26. This another state applies voltage signals, which are set in a temperature compensating circuit 28, to the receiving element 10. A DC voltage converting circuit 30 sets voltage signals for supplying to the temperature compensating circuit 28. When the voltage value of the output signals Vo is greater than the predetermined value $V_{th}$, the switching means 24 is set as shown in FIG. 11 to apply the output signal from the variable voltage circuit 22 to the receiving element 10.

This apparatus maintains the multiplication factor M as constant whenever "Pr<Ps". Therefore, the output voltage from the variable voltage circuit 22 may not be increased, even if no optical signal is input to the receiving element 10. This apparatus therefore has the advantage of preventing too high a signal bias, and thereby preventing the possibility of destruction of the receiving element 10. Nonetheless, the applied voltage to the receiving element, corresponding to the optimum value Mopt of the multiplication factor M, is different for each receiving element 10. Also the optimum value Mopt is temperature dependent, and changes corresponding to the changing of the temperature. Moreover, the multiplication factor M may change suddenly around the optimum value Mopt even if the changing of the applied voltage to the receiving element 10 is small. Therefore, in order to keep the multiplication factor M at the optimum value Mopt, it is necessary to accurately compensate the change of the applied voltage to the receiving element 10 due to the change of temperature. This gives rise to the need for temperature compensating circuit 28 and the output voltage from the compensating circuit 28 must be adjusted in accordance with each element so that the multiplication factor M of the element 10 can be kept constant because the characteristic between the applied voltage and the multiplication factor M is different in each element. This makes it complicated to keep the multiplication factor M at the optimum value Mopt in the element 10.

SUMMARY OF THE INVENTION

It is an object of the present invention to keep a multiplication factor of a light receiving means at an optimum value by a simplified construction.

It is a further object of the present invention to set a multiplication factor of a light receiving means at an optimum value when the receiving means receives minimum optical signals without compensation of a temperature change nor for the different characteristics of each element.

It is still a further object of the present invention to provide an apparatus which is able to apply to an optical digital signal transmission effectively.

To achieve the above objects and in accordance with the purpose of the invention, as embodied and broadly described herein, the invention provides an apparatus for automatically controlling gain. Optical signals are received by a receiving element and electrical signals corresponding to the optical signals are generated. The electrical signals are amplified by an amplifier and defined levels of the amplified signals are detected by a detector. Signals corresponding to the difference between detected signals and predetermined signals are generated by a generator. In response to output signals from the generator, a gain of the amplifier is controlled by a controller. Level of signals, which are supplied to the receiving element, are changed by an output device. A multiplication factor of the receiving element is adjusted by an adjusting device, which is included in the controller when the receiving element receives minimum optical signals.

BRIEF DESCRIPTION OF THE DRAWINGS

The present invention is best understood with reference to accompanying drawings in which:

FIG. 2 is a circuit diagram of the apparatus shown in FIG. 1;

DETAILED DESCRIPTION OF THE PREFERRED EMBODIMENT

An embodiment of the present invention will now be described with reference to the accompanying drawings.

Figure 1:
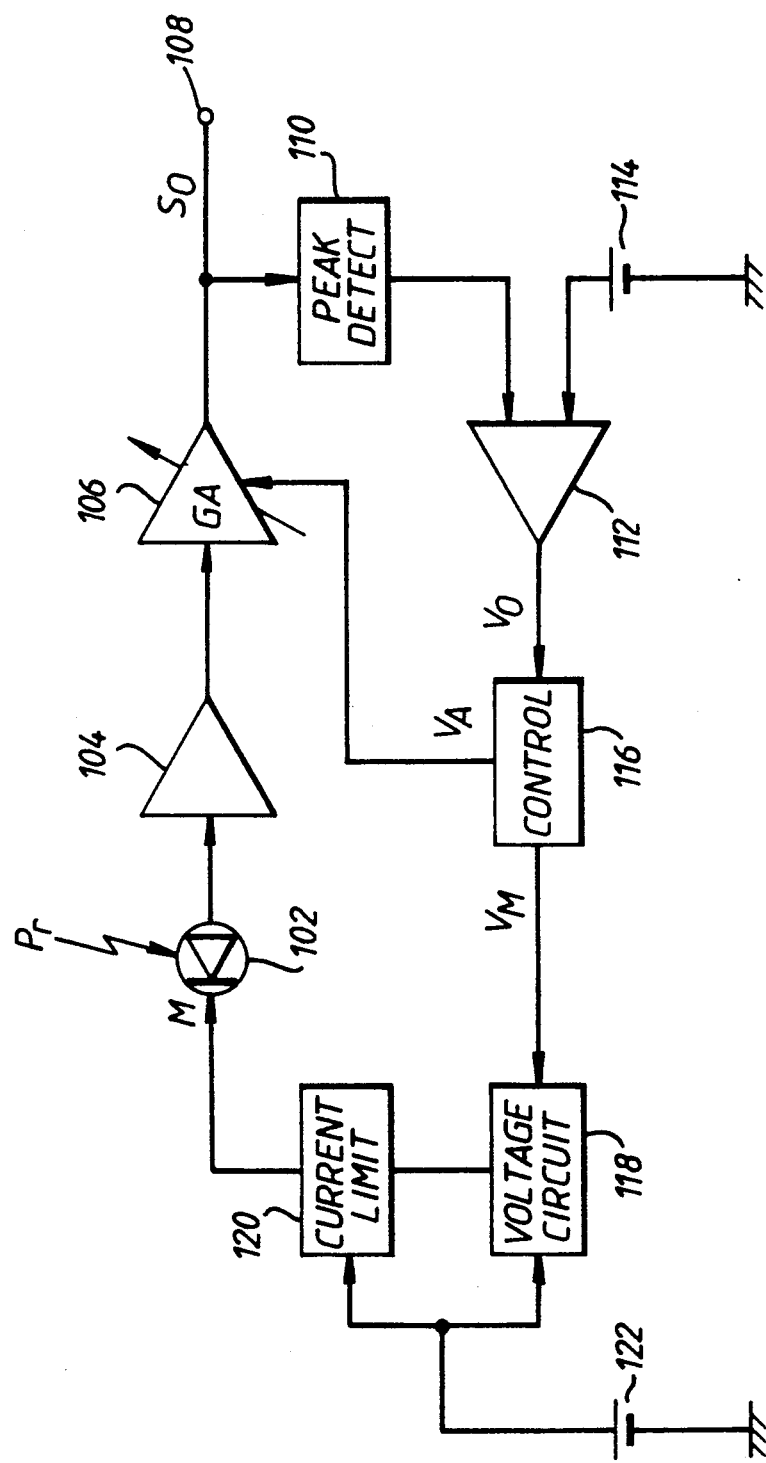
FIG. 1 is a block diagram of an apparatus according to one embodiment of this invention.

As shown in FIG. 1, an automatic gain control apparatus includes a light receiving element 102 such as an avalanche photodiode. The receiving element 102 receives optical signals with a signal level Pr and converts the optical signals into electrical signals. Output signals from the receiving element 102 are amplified by a pre-amplifier 104 and a variable gain amplifier 106. Output signals So from the amplifier 106 are supplied to an output terminal 1108 and a peak detecting circuit 110. The peak detecting circuit detects peak levels of the output signals from the variable gain amplifier 106 and generates peak voltage signals corresponding to these peak levels. A difference amplifier 112 compares the peak voltage signals from the peak detecting circuit 110 with a reference voltage signal from a reference voltage source 114 and amplifies signals corresponding to the difference between the peak voltage signals and the reference voltage signal. Amplified difference signals Vo from the difference amplifier 112 are supplied to controlling means 116. The controlling means 116 generates voltage signals VA and VM which respectively control the gain GA of the variable gain amplifier 106 and the multiplication factor M of the receiving element 102. A variable voltage circuit 118 is supplied with the voltage signals VM from the controlling means 116 and varies voltage values of bias signals being applied to the receiving element 102. A current limiter 120 prevents the receiving element 102 from being destroyed by excess bias currents due to an increase of the voltage value of the output signal from the circuit 118 when the receiving element 102 receives no optical signal. Output voltage signals from a high voltage source 122 are supplied to the voltage circuit 118 and the limiter 120.

FIG. 2 shows a schematic diagram of the apparatus shown in FIG. 1. The variable gain amplifier 106 includes capacitors C1 and C2, resistors R1 and R2, transistor (FET) Q1 and an amplifier 1061. The output signals from the pre-amplifier 104, corresponding to the optical signals, are supplied to a gate of the transistor Q1 through the capacitor C1. A drain of the transistor Q1 is connected to supply voltage terminal $V_{DD}$ through a resistor R2. A source of the transistor Q1 is grounded. The voltage signals VA from the controlling means 116 are applied to the gate of the transistor Q1 through the resistor R1. Output signals from the transistor Q1 are supplied to amplifier 1061 through the capacitor C2 to be further amplified.

The generating means 116 is constituted in this embodiment by clipping circuits 1161 and 1162. The clipping circuit 1161 includes a transistor Q2, a resistor R3 and a variable voltage source S1. A collector of the transistor Q2 is connected to voltage supplying terminal VEE and output voltage signals from the source S1 are applied to the base of the transistor Q2. The clipping circuit 1162 includes a transistor Q3, a resistor R4 and a variable voltage source S2. A collector of the transistor Q3 is connected to voltage Vcc (>VEE) supplying terminal and output voltage signals from the source S2 are applied to the base of the transistor Q3. Output signals Vo from the amplifier 112 are supplied to each emitter of the transistors Q2 and Q3 through resistor R3 and R4. Output voltage signals VA from the clipping circuit 1161 are supplied to the gate of the transistor Q1 through the resistor R1 and output voltage signals VM from the clipping circuit 1162 are supplied to the variable voltage circuit 118. The circuit 118 includes transistors Q4 and Q5, level shift diode D1 and resistors R5 and R6. The collector of the transistor Q4 is connected to the high voltage source 122 and the emitter is connected to one terminal of a series connection of the resistors R5 and R6 in series, while another terminal of the series connection is grounded. The base of the transistor Q4 is connected to the collector of the transistor Q5, which base is connected to the terminal between the resistors R5 and R6. The emitter of the transistor Q5 is connected to the level shift diode D1 which is provided with the output voltage signals VM of the clipping circuit 1162. The current limiter 120 includes a transistor Q6, resistors R7 and R8 and level shift diode D2. The collector of the transistor Q6 is connected to the collector of the transistor Q5 and the receiving means 102. The high voltage signals from the source 122 are supplied to the emitter of the transistor Q6 through the resistor R7. The level shift diode D2 is inserted between the source 122 and the base of the transistor Q6 which is grounded through the resistor R8. Characteristics of the clipping circuits 1161 and 1162 are shown in FIGS. 3(a) and 3(b).

Figure 3A:
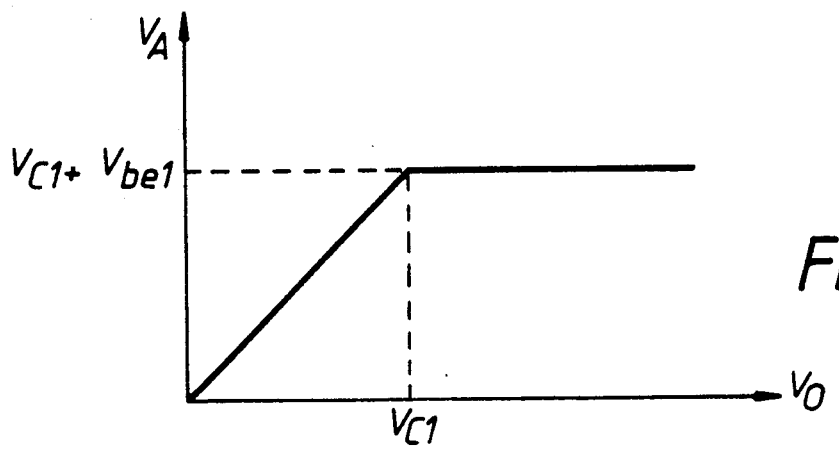
FIGS. 3(a) and 3(b) show characteristics illustrating the operation of controlling means shown in FIG. 2
Figure 3B:
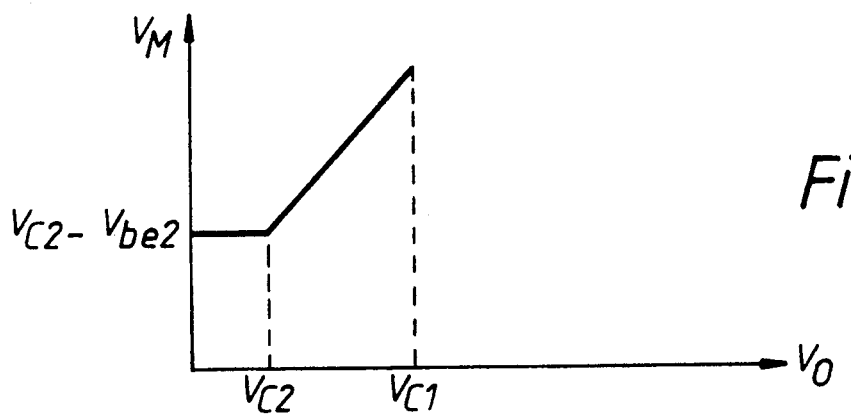

In operation, when the voltage value of the output signal Vo from the difference amplifier 112 is less than the voltage value Vc1 from the variable voltage source S1, the voltage value of the signal VA from the emitter of transistor Q2 is related to th values of the signal Vo, according to the gain characteristics of transistor Q2 as shown in FIG. 3(a). However, when the voltage value of the difference output signal Vo is greater than the value Vc1, the emitter-base junction of Q2 is forward biased, causing the value of the signal VA to be clamped at the constant value (Vc1+Vbe1) as shown in FIG. 3(a), where the value Vbe1 represents the voltage between the emitter and the base of the transistor Q2. FIG. 3(b) shows the characteristics of circuit 1162 when the value of the signal Vo is less than the value Vc2 (<Vc1) from the source S2, the transistor base-emitter junction is forward biased, causing the value of the signal VM to be clamped at a constant value (Vc2−Vbe2), where the value Vbe2 corresponds to the voltage between the emitter and the base of the transistor Q3. When the value of the signal Vo is more than the value Vc2, the value of the signal VM is proportional to the value of the signal V0.

The gain GA of the amplifier 106 is controlled by the signal vA from the first clipping circuit 1161. The second clipping circuit 1162 controls the signals VM which are supplied to the circuit 118, to be used for controlling the multiplication factor of the receiving element 102.

Figure 4:
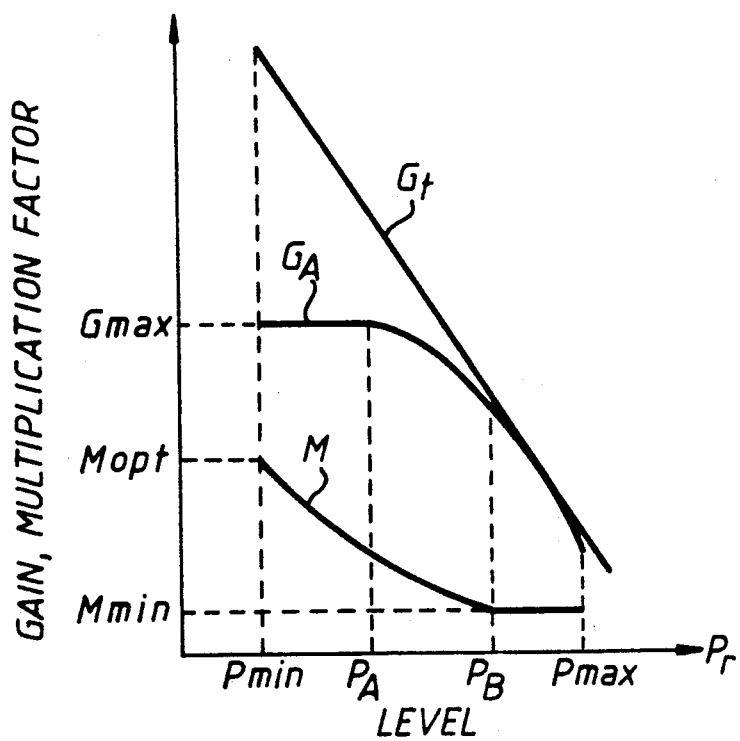
FIG. 4 shows characteristics illustrating the operation of an apparatus according to one embodiment of this invention.

FIG. 4 shows states of changing of the total gain Gt, including the gain GA of the amplifier 106 and the multiplication factor M of the receiving element 102 to levels Pr of the optical signals which the receiving element 102 receives. When the levels Pr are small levels, the difference between these signals and the reference voltage 114 is large, so the signals Vo from the difference amplifier 112 becomes a large voltage. Therefore, the signals VA from the clipping circuit 1161 becomes a constant voltage level (Vc1−Vbe1) as shown in FIG. 3(a). The function of the clipping circuit 1161, is shown in FIG. 4. The gain GA of the amplifier 106 is held constant at its maximum value $G_{max}$ when the levels Pr are greater than the minimum level $P_{min}$ and less than the predetermined level PA ($P_{min}<Pr<PA$). On the other hand, the multiplication factor M of the receiving element 102 may be changed by applied voltage from the variable voltage circuit 118 and may take the optimum value Mopt, at which the signal to noise ratio becomes a maximum value, in the minimum level $P_{min}$. If the level of the output signal from the gain-controlled amplifier 106 is expressed by So, the following equation holds when the level Pr is greater than or equal to the minimum level $P_{min}$ and less than or equal to the maximum level $P_{max}$ ($P_{min} \leq Pr \leq P_{max}$).

$$M \cdot GA = So/Pr \quad (1)$$

The maximum gain $G_{max}$ of gain controlled amplifier 106 may be adjusted by controlling the voltage Vc1 in the clipping circuit 1161 to thereby change the clamping level of voltage VA. Moreover, the optimum multiplication factor Mopt used by an optical signal corresponding to the minimum value, may be adjusted to the optimum value by the adjustment of the gain $G_{max}$. This follows the equation:

$$M = So/(P_{min} \cdot G_{max}) = Mopt \quad (2)$$

Figure 5:
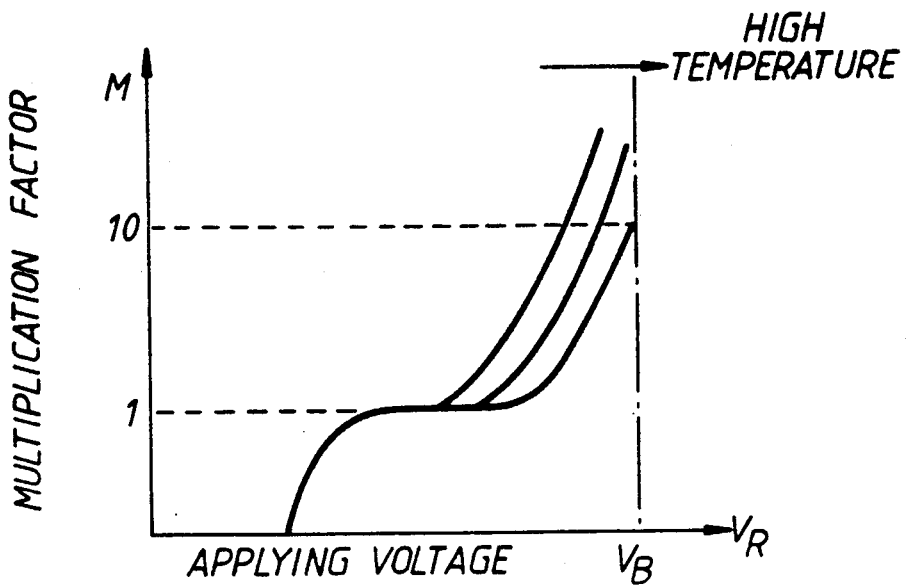
FIG. 5 shows a relation between applied voltage and multiplication factor M in a light receiving element shown in FIG. 1.

FIG. 5 shows a relation between the multiplication factor M and the applied voltage VR to the receiving element 102 assuming it to be an avalanche photodiode. The multiplication factor M increases rapidly just before the breakdown voltage VB of the avalanche photodiode. The breakdown voltage VB differs between different receiving elements and has properties to increase as the temperature increases.

Figure 6:
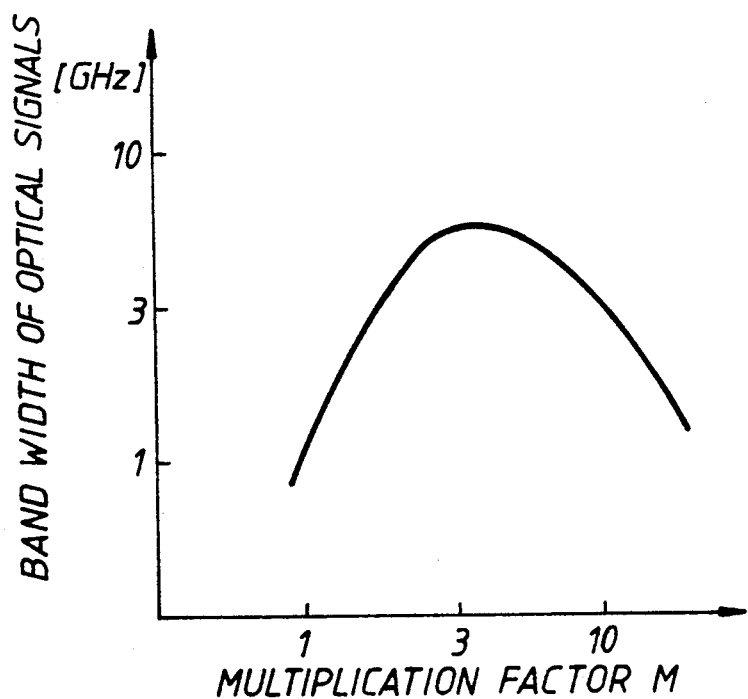
FIG. 6 shows a relation between multiplication factor M and bandwidth of receiving optical signals in a light-receiving element shown in FIG. 1.

The relation between multiplication factor M and bandwidth of receiving optical signals in the receiving element is shown in FIG. 6. The bandwidth has properties to decrease when the multiplication factor M is either small or great.

In the apparatus mentioned above, when the optical signal level Pr is greater than or equal to the minimum level $P_{min}$ and less than or equal to the level PA ($P_{min} \leq Pr = PR$), the optimum value Mopt of the multiplication factor M depends only on the optical signal level Pr and the maximum gain $G_{max}$ (constant) and may not depend on the characteristics of the multiplication factor M to the applied voltage in the receiving element 102 according to the equation (2). Therefore, the multiplication factor M in the optical signal level Pr ($P_{min} \leq Pr \leq PA$) may not change due to the change of the temperature and the difference in characteristics between different ones of the receiving element 102. When the optical signal level Pr in the receiving element 102 becomes greater than the level PA, the voltage of the output signals Vo from the amplifier 106 decreases and becomes less than the voltage $Vc_1$. This causes the clipping operation of the circuit 1161 to stop, so that the multiplication factor M and the gain GA change at the same time as shown in FIG. 4. Moreover, when the optical signal level Pr becomes greater than the level PB, but is still less than the maximum level $P_{max}$ and the voltage of the output signals Vo becomes less than the voltage $Vc_2$, the clipping circuit 1162 operates. This causes the voltage of the output signals VM from the circuit 1162 to be limited so that the multiplication factor M takes the constant value $M_{min}$ and only the gain GA changes. The value $M_{min}$ may be specified by an adjustment of the voltage $Vc_2$ in the clipping circuit 1162, as the minimum value within the region in which the receiving element 106 has no deterioration.

According to the operation of the clipping circuit 1162, the apparatus will not saturate when the optical signal level Pr is high. Furthermore, the waveform deterioration of the signal, due to the bandwidth deterioration in the receiving element 106, may be limited to its minimum when the applied voltage VR to the receiving element 106 is low and the multiplication factor M is small. Thus, the dynamic range, corresponding to the range of the receiving optical signal in which no code error arises, may be maximum.

Figure 7A:
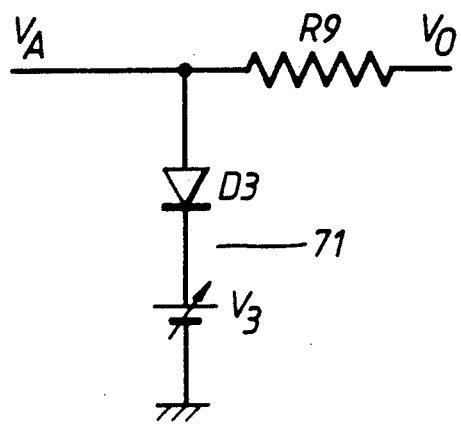
FIG. 7(a) and 7(b) are other circuit diagrams of the clipping circuit shown in FIG. 2.
Figure 7B:
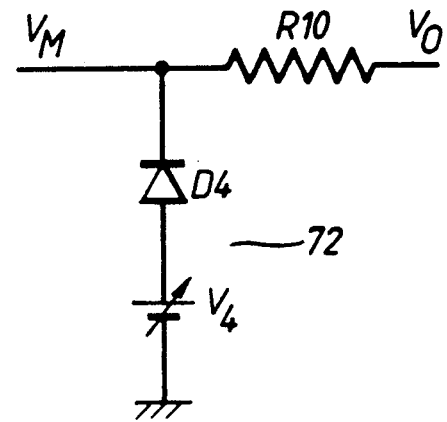

The clipping circuit 1161 shown in FIG. 2 may be replaced with the circuit 71 shown in FIG. 7(a) which includes a diode D3, a variable voltage source V3 and a resistor R9. The clipping circuit 1162 may be replaced with the circuit 72 shown in FIG. 7(b), which includes a diode D4, a voltage source V4 and a resistor R10. These circuits 71 and 72 operate the same as the circuits 1161 and 1162 respectively.

Figure 8A:
FIGS. 8(a) and 8(b) are other circuit diagrams of the current limiting means shown in FIG. 1.
Figure 8B:
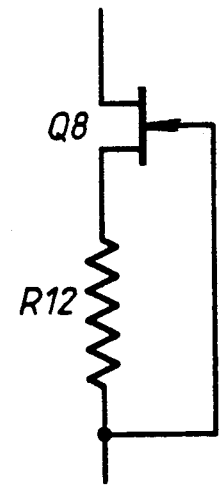

The current limiter 120 may be constituted by a resistor R11 shown in FIG. 8(a) or a transistor Q8 and a resistor R12 shown in FIG. 8(b).

Figure 9:
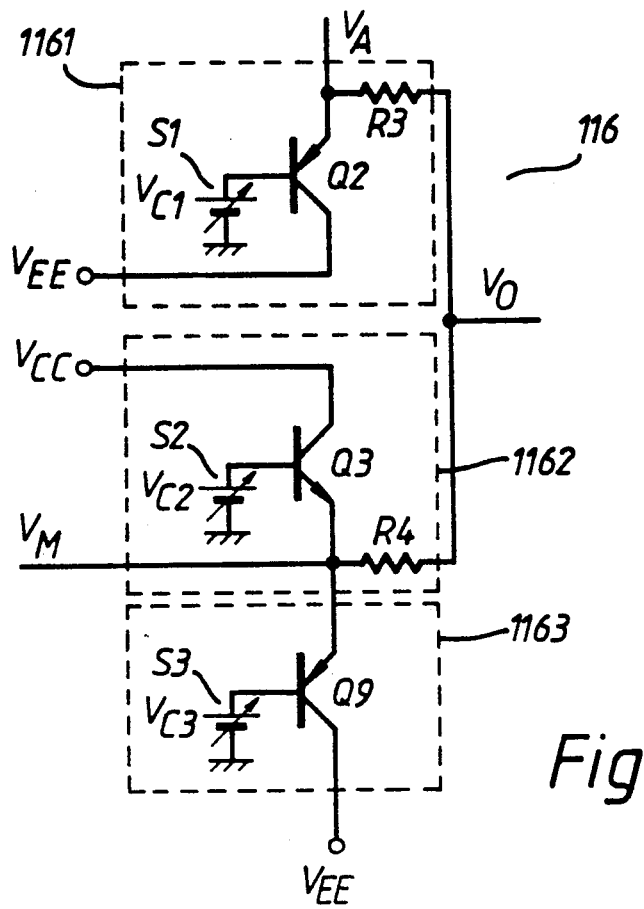
FIG. 9 is yet another circuit diagram of the controlling means shown in FIG. 1.
Figure 10:
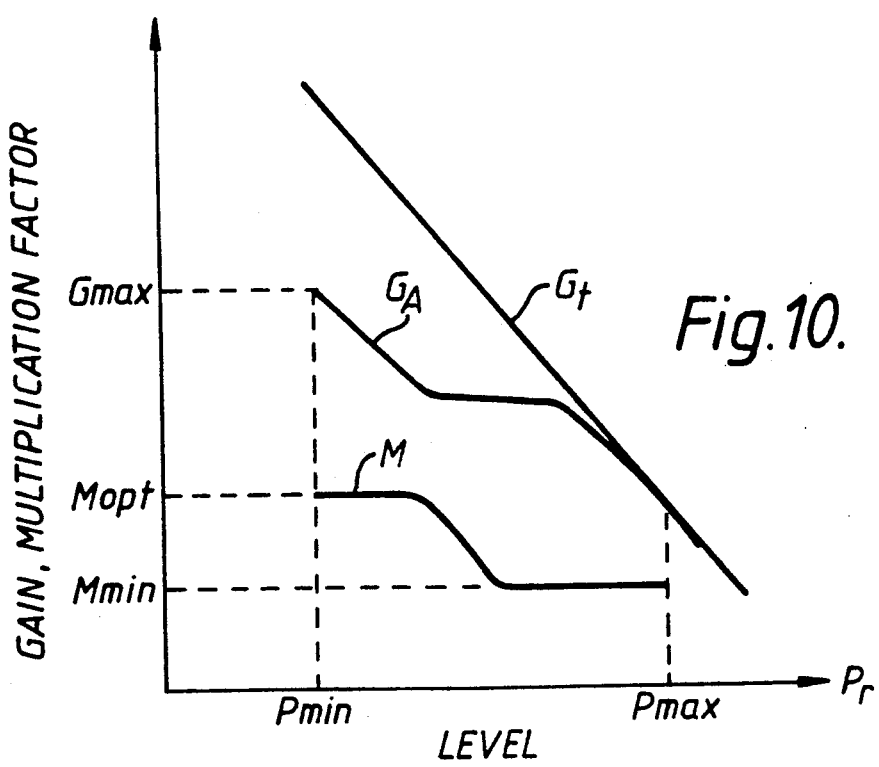
FIG. 10 shows another characteristic illustrating the operation of the apparatus shown in FIG. 1.
Figure 11:
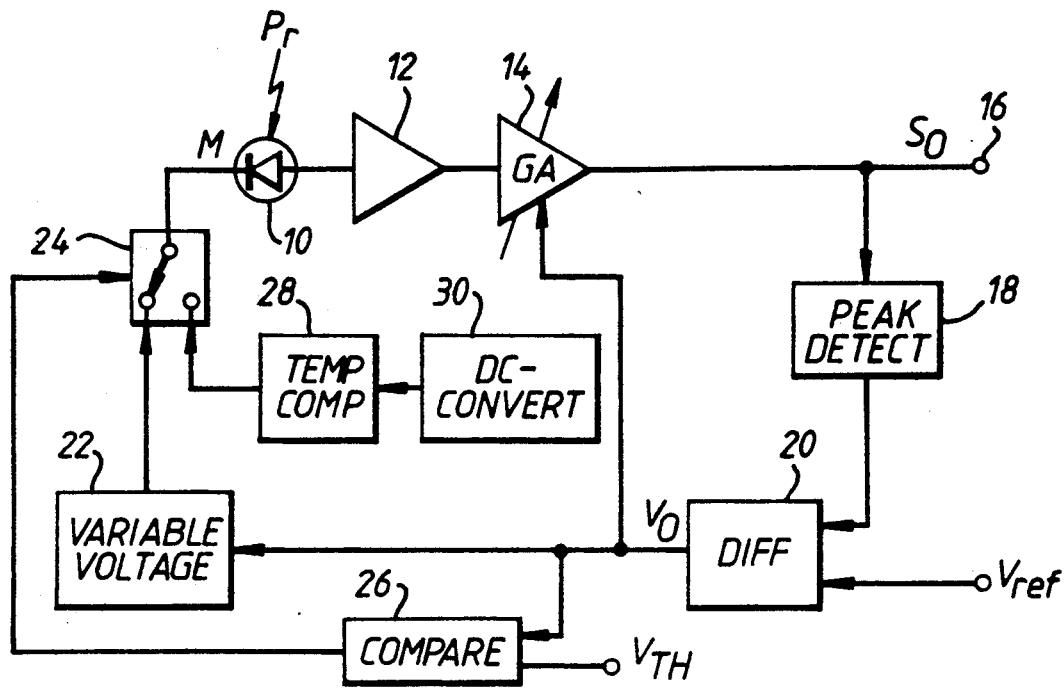
FIG. 11 is a block diagram of a known automatic gain control apparatus.
Figure 12:
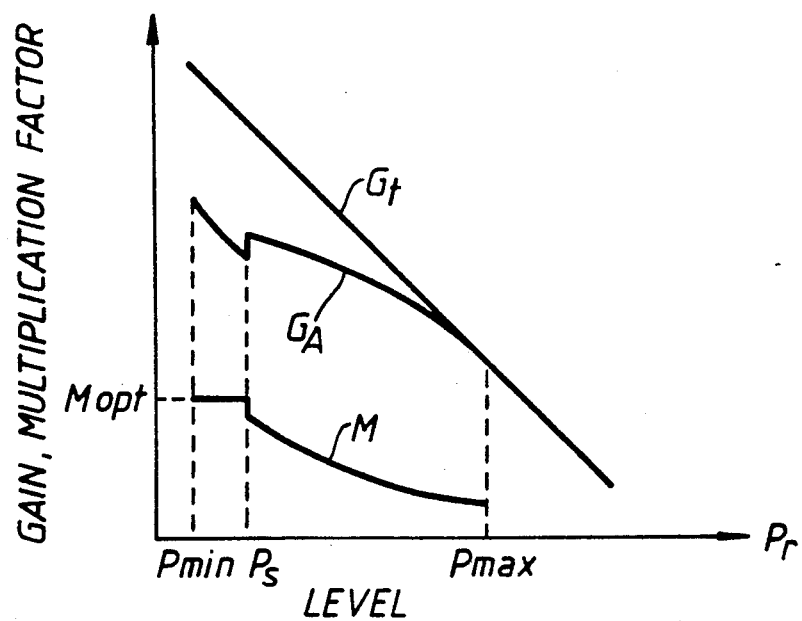
FIG. 12 shows characteristics illustrating the operation of the apparatus shown in FIG. 11.

Other modifications to the apparatus may also be used. For example, the generating means 116 may be constituted as shown in FIG. 9, that is, a clipping circuit 1163 may be added to the clipping circuits 1161 and 1162 shown in FIG. 2. The circuit 1163 includes a transistor Q9 and a variable voltage source S3 which applies a voltage Vc3 to the base of the transistor Q9. (Vc2<Vc1<Vc3). Furthermore, the gain GA and the multiplication factor M may be set using the characteristics shown in FIG. 10.

According to the present invention, it is possible to adjust the multiplication factor of the receiving element to an optimum value when the receiving element receives the minimum optical signal, regardless of the change of the characteristics of the multiplication due to the variation of temperature in the receiving element and the scatter of the characteristics in each receiving element.

Thus, the transmission characteristic of the optical signals may be stabilized and the reliability may be improved. Moreover, it is possible to stabilize the waveform of the output signal from the receiving element when the optical signal level is high.

Therefore, it is possible with the present invention to provide an improved automatic gain control apparatus that is suitable for optical digital signal transmission device.

What is claimed is:

1. An apparatus for automatically controlling gain, comprising:
    receiving means for receiving optical signals, and for generating electrical signals corresponding to the received optical signals using an adjustable multiplication factor which depends on a bias signal;
    variable gain control means for amplifying the electrical signals from the receiving means by an adjustable gain;
    difference determining means for determining a difference between the electrical signals from the variable gain control means and a predetermined signal;
    means for producing a first variable voltage having a value indicative of a maximum amount of adjustment of gain, and producing a second variable voltage indicative of a maximum adjustment of a bias amount; and
    controlling means, responsive to the difference determining means, for controlling a gain of the variable gain control means by producing a gain control signal that has a first clipping characteristic which is based on said first variable voltage, and for producing the bias signal using a second clipping characteristic which is based on said second variable voltage whereby the multiplication factor is limited to a certain level based on said second clipping characteristic.

2. The apparatus of claim 1, wherein the receiving means includes an avalanche photodiode.

3. The apparatus of claim 1, wherein the variable gain control means includes a pre-amplifier and an amplifier which as a gain that may be varied.

4. The apparatus of claim 1, wherein the controlling means includes means for holding the gain of the variable gain control means while the optical signals have levels between a minimum level and a first predetermined level; and
    means for decreasing the gain of the variable gain control means as levels of the optical signals increase above the first predetermined level.

5. The apparatus of claim 1, wherein the controlling means includes means for decreasing the multiplication factor of the receiving means as the levels of the optical signals increase from a minimum level to a first predetermined level; and
    holding means for holding the multiplication factor of the receiving means constant when the levels of the optical signals are greater than the first predetermined level.

6. The apparatus of claim 5, wherein the holding means includes means for holding the multiplication factor at a level to prevent damage to the receiving means.

7. The apparatus of claim 1, wherein the voltage supplying means includes means for setting the clipping voltage at a level to prevent damage to the receiving means.

8. The apparatus of claim 1, further comprising detecting means for detecting defined levels of output signals from the receiving means.

9. The apparatus of claim 8, wherein the detecting means comprises a peak detector.

10. A method of automatically controlling gain, comprising the steps of:
    receiving optical signals in a receiving means which multiplies the received optical signals by an amount dependent on an applied bias;
    generating electrical signals corresponding to the optical signals;
    producing a first variable voltage indicative of a maximum amount of adjustment of gain $G_{max}$;
    amplifying the electrical signals by a variable gain to produce amplified electrical signals having a level $S_o$;
    detecting defined levels of the amplified electrical signals;
    determining a difference between the detected level and a predetermined level;
    controlling the variable gain in accordance with the difference to a certain level; and
    changing the bias being applied to the receiving means in accordance with the difference in a way to adjust the multiplication factor of the receiving means to set a multiplication factor M according to $M = S_o/(P_{min} \cdot G_{max})$ where $P_{min}$ is a minimum level of said received optical signals.

11. The method of claim 10, wherein the gain controlling step includes the steps of adjusting said bias to decrease the multiplication factor of the receiving means as the levels of the optical signals increase from a minimum level to a first predetermined level; and
    holding the multiplication factor of the receiving means constant when the levels of the optical signals are greater than the first predetermined level.

12. The method of claim 11, wherein the step of holding the multiplication factor includes the step of setting the multiplication factor at a level to prevent damage to the receiving means.

13. The method of claim 10, wherein the step of amplifying the electrical signals also includes the step of pre-amplifying the electrical signals.

14. The method of claim 10, wherein the gain controlling step includes the step of clipping a signal corresponding to the difference between the detected level and the predetermined level.

15. The method of claim 10, wherein the limiting step includes the step of setting a clipping voltage to the signal corresponding to the difference between the detected level and the predetermined level.

16. The method of claim 10, wherein the bias changing step includes the step of limiting the bias signal being supplied to the receiving means.

17. The method of claim 10, wherein the gain controlling step includes the steps of holding the gain at a determined value when the optical signals have levels between a minimum level and a first predetermined level; and decreasing the gain as levels of the optical signals increase from the first predetermined level.

18. The method of claim 15, wherein the step of setting a clipping voltage includes the step of selecting the clipping voltage at a level to prevent damage to the receiving means.

19. An automatic gain controlled light receiver device comprising:

first means including a light detector for receiving light and for converting the light to an electrical signal, using an adjustable multiplication factor which depends on a bias signal that is applied thereto, and a variable gain amplifier, for amplifying an output of the light detector by a variable gain, which is adjusted by a gain signal;

difference detecting means, receiving the electrical signal, for comparing the electrical signal with a first level, and producing a difference signal indicative of the difference;

means for producing an adjustable first reference and an adjustable second reference;

controlling means, connected to receive the difference signal and said first reference, for producing the bias signal and the gain signal for the first means by:
(1) when the difference signal has a first predetermined relationship with the first reference amplifying said difference signal to produce said gain signal which is used to control the variable gain amplifier; and
(2) when the difference signal has a second predetermined relationship with the first reference, outputting a constant level signal as the gain signal to control the variable gain amplifier;
(3) when the difference signal has a third predetermined relationship with the second reference, amplifying the difference signal to produce the bias signal; and
(4) when the difference signal has a fourth predetermined relationship with the second reference, outputting a constant level signal as the bias signal.

20. The device of claim 19, wherein the first means comprises a light detector; and wherein the controlling means is also connected to receive a second adjustable reference, and is also for
(3) when the difference signal has a third predetermined relationship with the second reference, amplifying the difference signal to produce the bias signal; and
(4) when the difference signal has a fourth predetermined relationship with the second reference, outputting a constant level signal as the bias signal.

21. The device of claim 20, wherein the light detector is an avalanche photodiode.

22. The device of claim 20, wherein the third predetermined relationship is the difference signal being greater than the second reference, and the fourth predetermined relationship is the difference signal being less than the second reference.

23. The device of claim 22, wherein the controlling means includes a clipping amplifier, which amplifies the difference signal when it is greater than the second reference, and which produces a constant value output when the difference signal is less than the second reference.

24. The device of claim 23, wherein the clipping amplifier includes transistor means, having its base connected to receive the first reference, and its emitter connected to receive the difference signal, so that when the difference signal is less than a voltage on the base Vc2 minus a voltage between the base and emitter Vbe2, an output thereof is clamped at (Vc2−Vbe2).

25. The device of claim 23, wherein the clipping amplifier includes a diode, connected at one end to the reference, and at another end to produce the bias signal.

26. The device of claim 19, wherein the first predetermined relationship is the difference signal being less than the first reference, and the second predetermined relationship is the difference signal being greater than the first reference.

27. The device of claim 20, wherein the controlling means includes means for adjusting a level of the first and second references.

28. The device of claim 20, wherein the controlling means includes first and second clipping amplifiers, the second clipping amplifier which amplifies the difference signal when it is greater than the second reference, and which produces a constant value output when the difference signal is less than the second reference, and the first clipping amplifier which amplifies the difference signal when it is less than the first reference, and produces a constant value when the difference signal is greater than the first reference.

29. The device of claim 28, wherein the first clipping amplifier includes transistor means, having its base connected to receive the first reference, and its emitter connected to receive the difference signal, so that when the difference signal is less than a voltage on the base Vc1 plus a voltage between the base and emitter Vbe1, and output thereof is clamped at (Vc1+Vbe1).

30. A method of automatically gain controlling a light receiver device, comprising the steps of:

receiving light and converting the received light to an electrical signal using an adjustable multiplication factor which depends on a bias signal that is applied thereto;

producing a first variable voltage reference by choosing a level indicative of a maximum amount of gain $G_{max}$;

comparing said electrical signal with said first reference, and producing a difference signal indicative of the difference;

producing a signal which is used to control a variable gain amplifier by, when the difference signal has a first predetermined relationship with said first reference, amplifying the difference signal to produce said signal; and producing said signal which is used to control the variable gain amplifier by, when the difference signal has a second predetermined relationship with said first reference, outputting a constant level signal as the signal to control the variable gain amplifier;

amplifying the electrical signal using said variable gain amplifier controlled by said signal to produce an amplified signal having a level $S_o$;

producing a second reference signal by choosing a level indicative of a multiplication factor M according to $M = S_o/(P_{min} \cdot G_{max})$ where $P_{min}$ is a minimum level of said received optical signals;

producing the bias signal by, when the difference signal has a third predetermined relationship with the reference, amplifying the difference signal to produce the bias signal, and producing the bias signal by, when the difference signal has a fourth predetermined relationship with the reference, outputting a constant level signal as the bias signal.

* * * * *